United States Patent
Sprouse et al.

(10) Patent No.: US 9,053,808 B2
(45) Date of Patent: Jun. 9, 2015

(54) FLASH MEMORY WITH TARGETED READ SCRUB ALGORITHM

(75) Inventors: Steven T. Sprouse, San Jose, CA (US); Alexandra Bauche, San Jose, CA (US); Yichao Huang, San Jose, CA (US); Jian Chen, Menlo Park, CA (US); Jianmin Huang, Sunnyvale, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 22 days.

(21) Appl. No.: 13/529,522

(22) Filed: Jun. 21, 2012

(65) Prior Publication Data

US 2013/0346805 A1    Dec. 26, 2013

(51) Int. Cl.
G06F 11/00 (2006.01)
G11C 16/34 (2006.01)
G11B 20/18 (2006.01)

(52) U.S. Cl.
CPC ........ G11C 16/3418 (2013.01); G11B 20/1883 (2013.01); G11B 20/18 (2013.01); *G11C 16/3427* (2013.01); G11C 16/3431 (2013.01)

(58) Field of Classification Search
USPC ................. 714/32, 42, 54; 365/200, 201, 222
See application file for complete search history.

(56) References Cited

U.S. PATENT DOCUMENTS

| | | | |
|---|---|---|---|
| 5,768,193 A | 6/1998 | Lee et al. | |
| 8,031,531 B1 | 10/2011 | Sutardja | |
| 8,107,295 B2 * | 1/2012 | Lee et al. | 365/185.18 |
| 8,499,210 B2 * | 7/2013 | Kim et al. | 714/746 |
| 8,503,257 B2 * | 8/2013 | Post et al. | 365/200 |
| 2006/0039196 A1 | 2/2006 | Gorobets et al. | |
| 2008/0294949 A1 * | 11/2008 | Sugahara | 714/718 |
| 2008/0320342 A1 | 12/2008 | Imagawa et al. | |
| 2009/0172267 A1 | 7/2009 | Oribe et al. | |
| 2010/0124119 A1 * | 5/2010 | Lee et al. | 365/185.18 |
| 2010/0157671 A1 | 6/2010 | Mokhlesi | |
| 2010/0235715 A1 * | 9/2010 | Thatcher et al. | 714/763 |
| 2010/0332943 A1 | 12/2010 | D'Abreu et al. | |
| 2011/0113281 A1 * | 5/2011 | Zhang et al. | 714/6.12 |
| 2011/0145668 A1 * | 6/2011 | Kim et al. | 714/746 |
| 2012/0060066 A1 | 3/2012 | Nagadomi et al. | |
| 2013/0151753 A1 * | 6/2013 | Jeon et al. | 711/103 |

OTHER PUBLICATIONS

International Search Report and Written Opinion issued in international application No. PCT/US2013/043692, mailed on Oct. 2, 2013 (11 pages).

* cited by examiner

*Primary Examiner* — Gabriel Chu
*Assistant Examiner* — Paul Contino
(74) *Attorney, Agent, or Firm* — Brinks Gilson & Lione

(57) ABSTRACT

A method and system have been described for counteracting and correcting for read disturb effects in blocks of flash memory. The method may include the step of a controller of the memory system performing a read scrub scan on only a portion of one targeted word line in a block at desired intervals. The controller may calculate whether a read scrub scan is necessary based on a probabilistic determination that is calculated in response to each received host read command. The controller may then place a block associated with the targeted word line into a refresh queue if a number of errors are detected in the targeted word line that meets or exceeds a predetermined threshold. The block refresh process may include copying the data from the block into a new block during a background operation.

17 Claims, 12 Drawing Sheets

FLASH MEMORY WITH TARGETED READ SCRUB ALGORITHM

BACKGROUND

Non-volatile memory systems, such as flash memory, have been widely adopted for use in consumer products. Flash memory is used in numerous applications including mobile phones, digital cameras, MP3 players and many other applications. Flash memory may be found in different forms, for example in the form of a portable memory card that can be carried between host devices or as a solid state disk (SSD). In order to be cost efficient, it is desirable to implement SSD memories using high density Multi-Level Cell (MLC) flash memories rather than Single-Level Cell (SLC) flash memory which has 1-bit per cell storage capacity. Using MLC technology, the memory capacity can be increased by a factor of 2, 3 or more (for memories storing 2, 3 or more bits in each cell, respectively) as compared to SLC flash without increasing the physical dimensions of the memory. What increases in MLC flash is the amount of data stored in each memory cell and in each physical page (Word Line (WL)) of the memory.

Data stored in flash memory is susceptible to corruption due to various factors. Data in flash memory may be corrupted simply by ordinary read, program and erase sequences, where memory cells in physical proximity to those that are subject to a read, program or erase action may be unintentionally stressed to a point where stored charge levels are altered enough such that bit errors are induced in those memory cells. With respect to read operations, read stress is induced not only on the word line being read but also when the read voltage is applied to other word lines in a physical memory block. The stress on word lines not being read is sometimes referred to as a read disturb effect. If a block is being read unevenly, some pages may be corrupted without being read. Error correction codes (ECC) are typically implemented when storing and retrieving data in order to improve the chance that the data can be read from flash memory without errors. When the corruption is beyond the ability of the ECC algorithm to repair, however, the system may completely lose the data in those pages.

Prior attempts to address read disturb effects typically involve a read scrub procedures where data is copied from one block to another block so that the ECC algorithm used by the flash memory device can attempt to correct accumulated errors in the block during the copy process. Some existing read scrub processes are automatically performed at regular intervals, where a block will be copied after a fixed number of read operations and the flash memory device tracks and stores multiple counters for each of the blocks. This approach may require that the flash memory device use processing and storage resources to maintain and update the various counters. This approach may also potentially lead to performing frequent and unnecessary copying operations that can affect performance and life span of the flash memory device.

SUMMARY

In order to address the problems noted above, a system and method for implementing a targeted read scrub algorithm is disclosed. According to a first aspect of the invention, a method is disclosed for counteracting read disturb effects in a flash memory device. The method may include the controller of the flash memory device receiving a read command from a host and determining if a scan for errors of a portion of the flash memory device is necessary in response to the read command. In response to determining that the scan is necessary, the controller may identify a word line of the flash memory to scan, scan the identified word line for data errors without scanning any other word line in a block containing the identified word line, and place the block in a refresh queue if an error threshold is detected in the identified word line. The blocks in the refresh queue may be refreshed during a later background process by copying data from the blocks to new blocks.

In another aspect of the invention, a memory system having a non-volatile memory and a controller in communication with the non-volatile memory is disclosed. The controller may be configured to execute the method noted above

BRIEF DESCRIPTION OF THE PRESENTLY PREFERRED EMBODIMENTS

Figure 1:
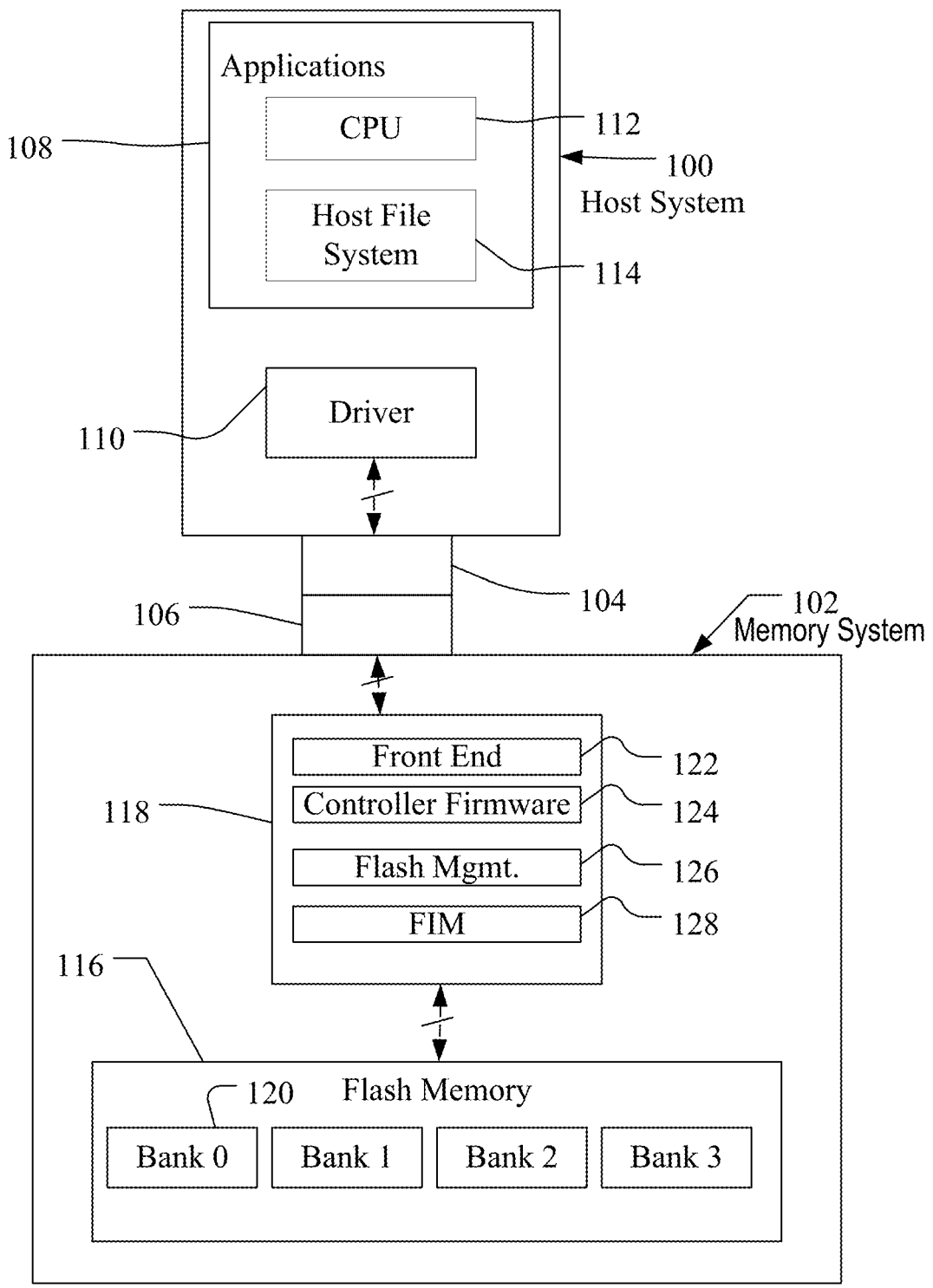
FIG. 1 illustrates a host connected with a memory system having multi-bank non-volatile memory.

A flash memory system suitable for use in implementing aspects of the invention is shown in FIGS. 1-7. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

One example of a commercially available SSD drive is a 32 gigabyte SSD produced by SanDisk Corporation. Examples of commercially available removable flash memory cards include the CompactFlash (CF), the MultiMediaCard (MMC), Secure Digital (SD), miniSD, Memory Stick, and TransFlash cards. Although each of these cards has a unique mechanical and/or electrical interface according to its standardized specifications, the flash memory system included in each is similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, cellular telephones, personal digital assistants (PDAs), digital still cameras, digital movie cameras and portable audio players. For portable memory card applications, a host may include a built-in receptacle for one or more types of memory cards or flash drives, or a host may require adapters into which a memory card is plugged. The memory system usually contains its own memory controller and drivers but there are also some memory-only systems that are instead controlled by software executed by the host to which the memory is connected. In some memory systems containing the controller, especially those embedded within a host, the memory, controller and drivers are often formed on a single integrated circuit chip.

The host system 100 of FIG. 1 may be viewed as having two major parts, insofar as the memory system 102 is concerned, made up of a combination of circuitry and software. They are an applications portion 108 and a driver portion 110 that interfaces with the memory system 102. In a PC, for example, the applications portion 110 can include a processor 112 running word processing, graphics, control or other popular application software, as well as the file system 114 for managing data on the host 100. In a camera, cellular telephone or other host system that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as a flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The flash memory 116 may include any number of memory banks 120 and four memory banks are shown in FIG. 1 simply by way of illustration. Functionally, the system controller 118 may include a front end 122 that interfaces with the host system, controller logic 124 for coordinating operation of the memory 116, flash management logic 126 for internal memory management operations such as system initiation, writing data within a block, bad block management and handling block linkage information, as well as one or more flash interface modules (FIMs) 128 to provide a communication interface between the controller with the flash memory 116.

Figure 2:
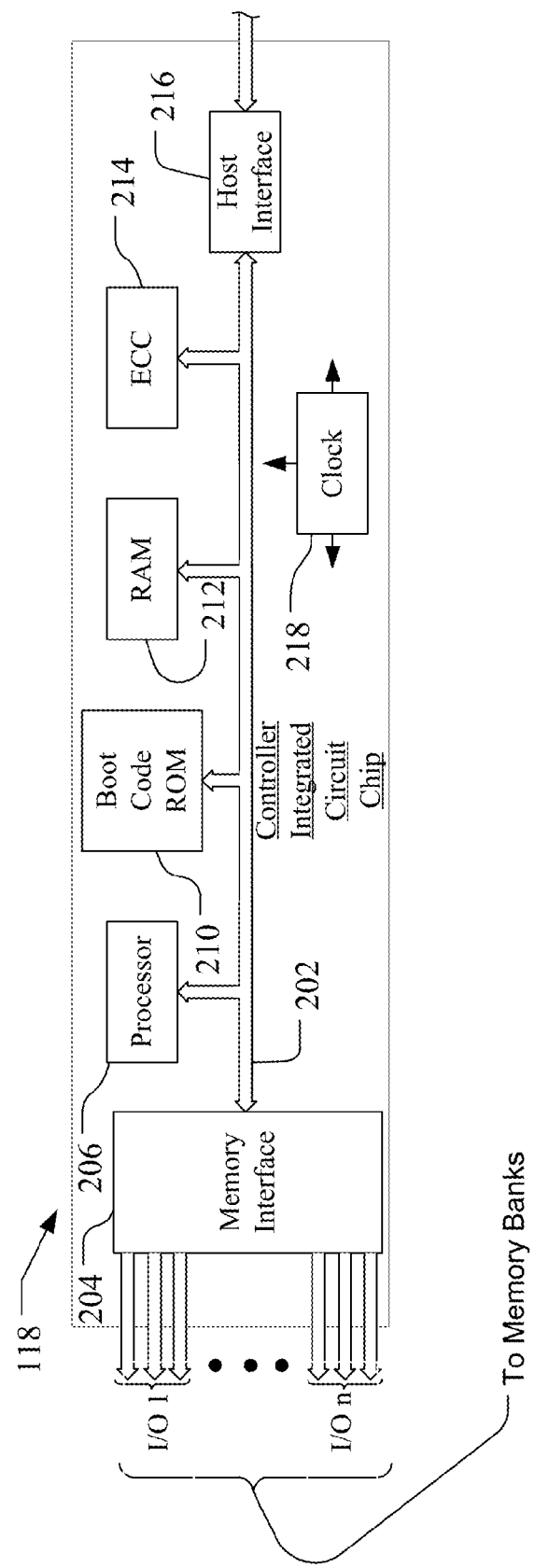
FIG. 2 is an example block diagram of an example flash memory system controller for use in the non-volatile memory of FIG. 1.

The system controller 118 and may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
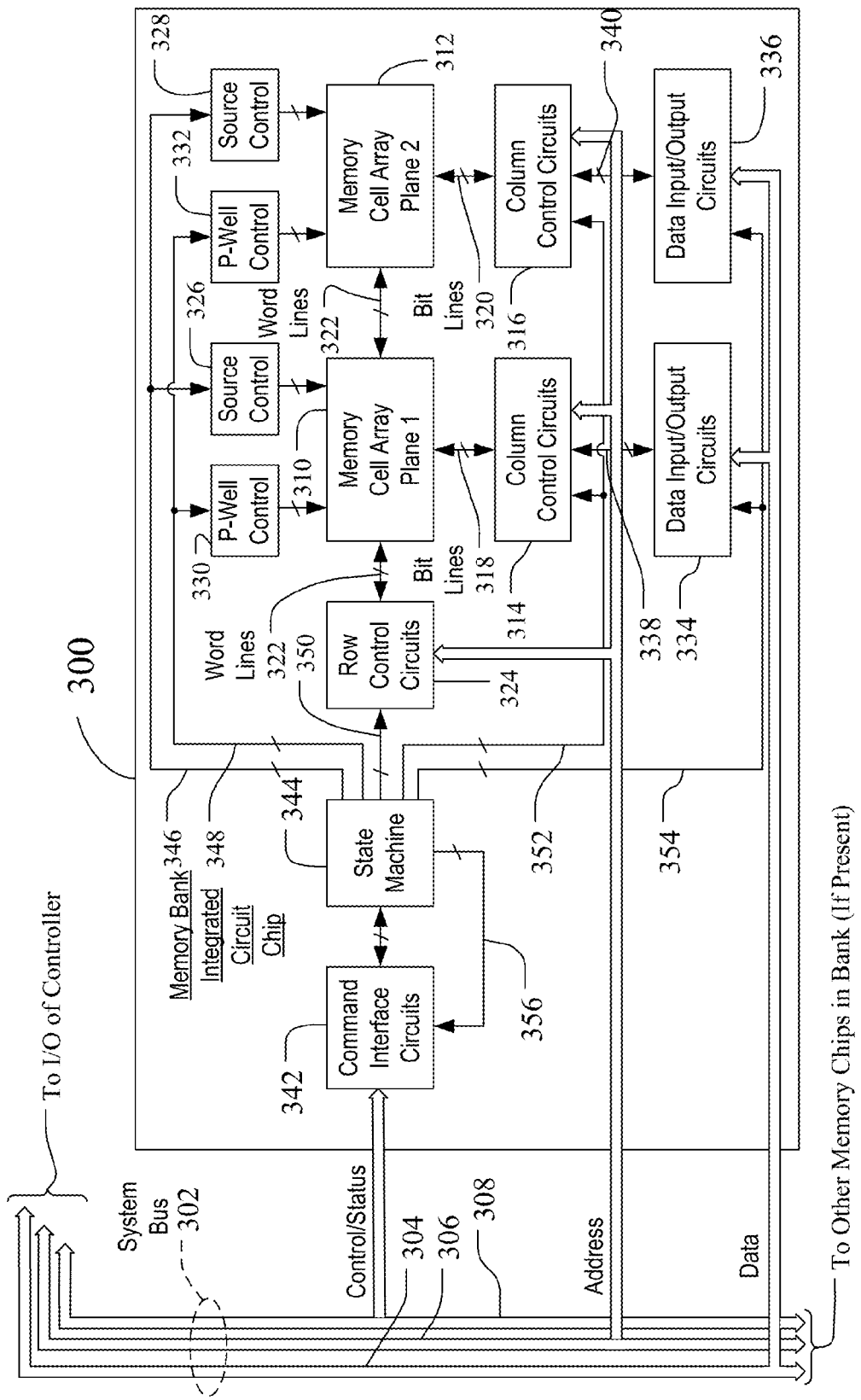
FIG. 3 is an example one flash memory bank suitable as one of the flash memory banks illustrated in FIG. 1.

Each bank 120 in the flash memory 116 may consist of one or more integrated circuit chips, where each chip may contain an array of memory cells organized into multiple planes. An illustration of a memory bank 300 on a single chip is shown in FIG. 3. The memory bank 300 of FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 19. Source voltage control circuits 326 and 328 are also connected with the respective planes, as are p-well voltage control circuits 330 and 332. If the bank 300 is in the form of a memory chip with a single array of memory cells, and if two or more such chips exist in the system, the array of each chip may be operated similarly to a plane within the multi-plane chip described above.

Data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Each memory chip in each bank 120 contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other non-volatile memory architectures or technologies, alone or combination, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
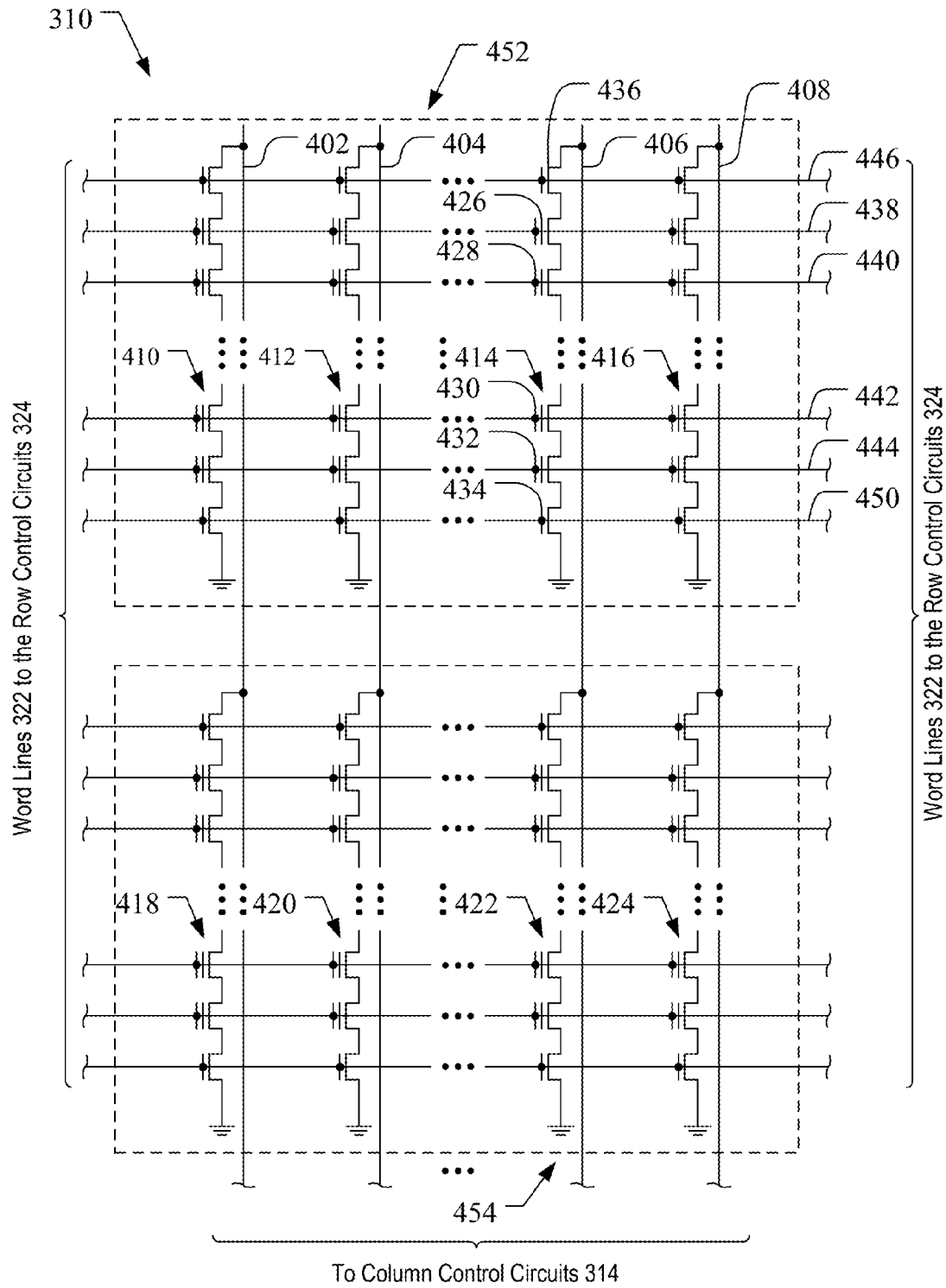
FIG. 4 is a representative circuit diagram of a memory cell array that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
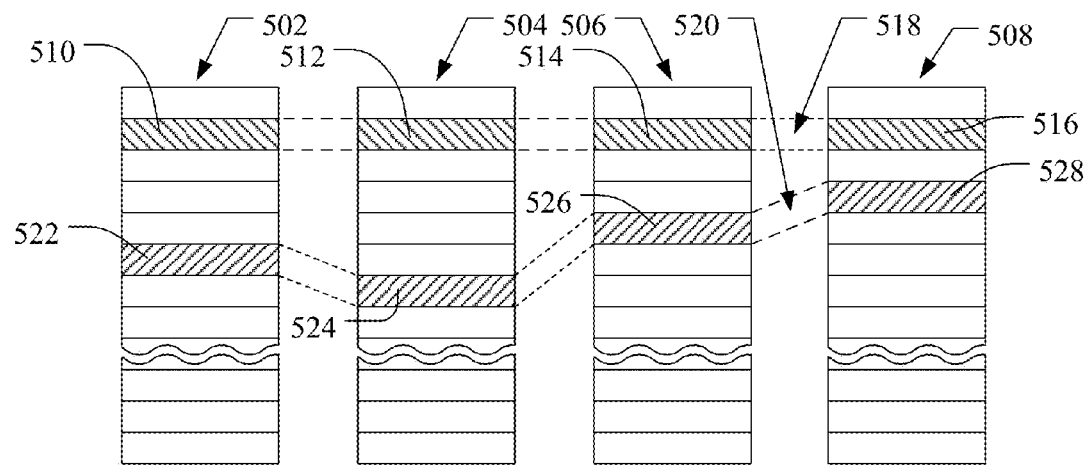
FIG. 5 illustrates an example physical memory organization of the memory bank of FIG. 3.

FIG. 5 conceptually illustrates an organization of one bank 120 of the flash memory 116 (FIG. 1) that is used as an example in further descriptions below. Four planes 502-508 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 5 by rectangles, such as blocks 510, 512, 514 and 516, located in respective planes 502-508. There can be hundreds or thousands of blocks in each plane.

As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
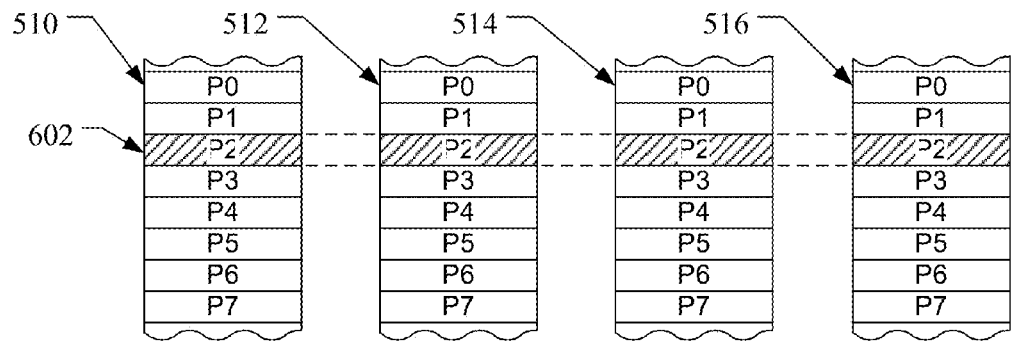
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 16, 32 or more pages of memory cells within each block. The page is the unit of data programming within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a bank, a metapage is the maximum unit of programming.

The blocks disclosed in FIGS. 4-5 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host 100. The LBAs are then mapped to one or more physical blocks in the memory system 102 where the data is physically stored.

In implementations utilizing MLC memory arranged to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 7:
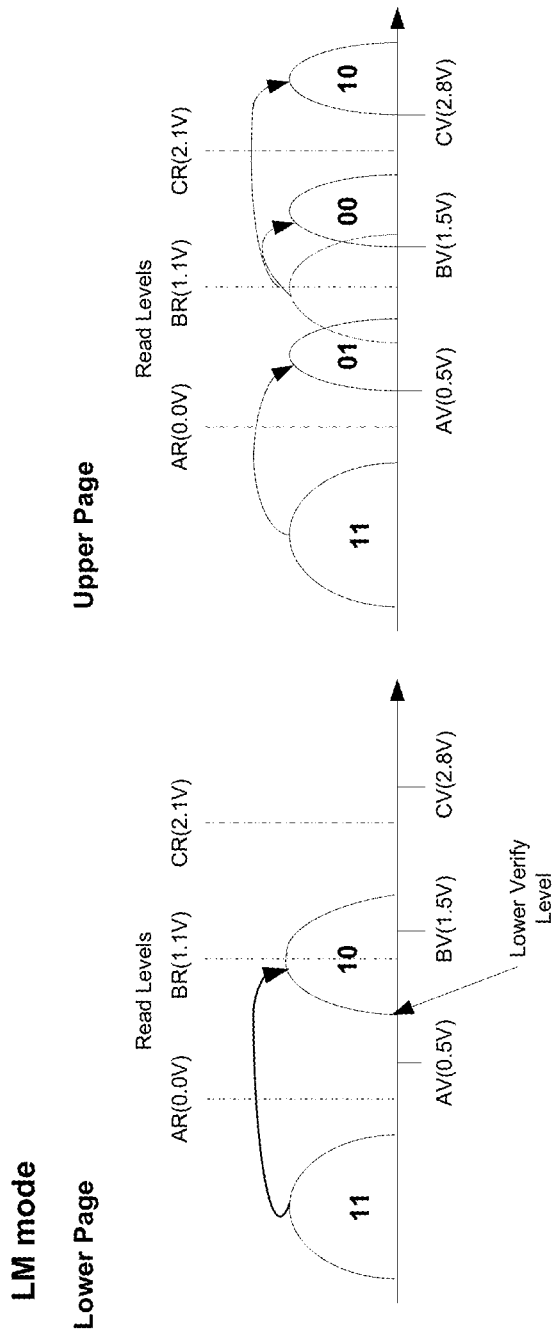
FIG. 7 illustrates charge levels in a MLC memory operated to store two bits of data in a memory cell.

FIG. 7 illustrates one implementation of the four charge levels used to represent two bits of data in a memory cell. FIG. 7 is labeled as LM mode which may be referred to as lower at middle mode and will further be described below regarding the lower at middle or lower-middle intermediate state. The LM intermediate state may also be referred to as a lower page programmed stage. A value of "11" corresponds to an unprogrammed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC flash is two bits per cell, a logical page may include all the least significant bits of the cells on the word line that are grouped together. In other words, the lower page is made up of the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

When a read operation takes place in a flash memory, word lines physically adjacent those that have read can be affected. Furthermore, a particular page of a word line may be more susceptible to read disturb effects in a word line. For example, in MLC flash memory having 2 bit per cell storage capacity such as shown in FIG. 7, the upper page bit may be more susceptible than the lower page bit to corruption due to read operations in adjacent word lines. Additionally, the design of a particular memory die, or even a different manufacturing run of dies of a same design, may result in a particular word line being more susceptible than other word lines to read disturb effects. For example, one design or manufacturing run may result in one pattern of read disturb effects for a given write operation, while another design or manufacturing run may result in a different pattern.

Figure 8:
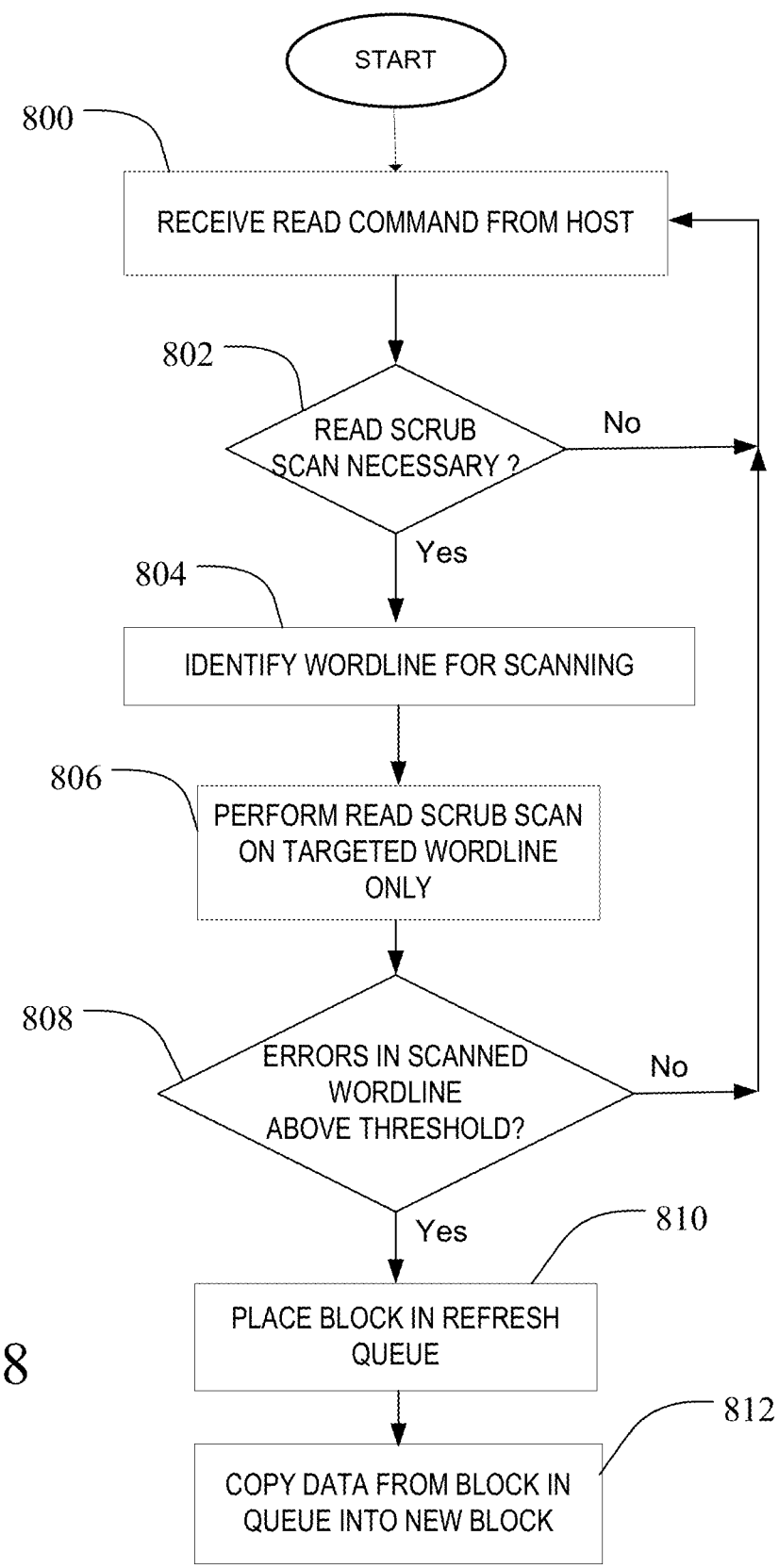
FIG. 8 is a flow chart of an embodiment of a method for performing targeted read scrub in a flash memory system.

In order to optimize the use of a read scrub procedure, a targeted read scrub method such as illustrated in FIG. 8 is contemplated. First, a read command is received from a host at the flash memory device (at 800). The controller of the flash memory device may then determine if a scan for errors, referred to herein as a read scrub scan, in a certain portion of the flash is necessary (at 802). This determination may be made before the pending read command is executed or immediately after the read command is executed. If no read scrub scan is necessary according to the determination, then further read commands from the host are received and a determination is made for each incoming host read command whether a read scrub scan is appropriate. When it is determined that a scan for errors is necessary after receiving a read command, the controller identifies the particular word line in the flash memory that should be scanned (at 804). The particular word line to be scanned is identified by using a predetermined offset stored in a storage location in the memory device. This predetermined offset may be one based on an estimated word line that is most susceptible to read disturb effects, or may be based on information provided at manufacture that takes into account modeled or actual testing of a particular design, or manufacturing run of the design. The predetermined offset, or offsets, indicate the offset from the word lines that are part of a read command at which read disturb effects are most likely to be found.

Once the word line has been identified for scanning, that word line is scanned by the controller to identify the number of data errors in that word line (at 806). In this embodiment, only the one identified word line is scanned during a read scrub scan triggered by a host read command when a read scrub scan is determined to be necessary. The identified word line may be a word line positioned in the same physical block as the word lines identified in the host read command that triggered the read scrub scan, but offset by an amount determined by the predetermined offset stored in the memory device. In one embodiment, the scan may consist of only scanning the upper page of the identified word line for bit errors. The upper page of the identified word line may be scanned by comparing the stored bits of the upper page with expected bits calculated using the error correction code algorithm implemented on the memory device. Any of a number of known ECC algorithms are suitable for this purpose. The number of errors found on the upper page of the identified word line are then compared to a predetermined threshold. The order of operations (e.g. servicing the host read, determining if there is a need to do a read scrub scan, and performing a read scrub scan if needed) may depend on the system requirements and the host protocol, for example whether specific timeouts need to be met or not, and so on.

If the number of data errors detected in the read scrub scan of the upper page of the selected word line is less than the predetermined threshold, then no further action is taken and the process returns to receiving host read commands from the host and determining for each read command whether another scan for errors is necessary (at 808, 800). If, instead, the read scan of the upper page of the selected word line indicates that the errors are above the predetermined threshold, then the entire physical block in which the word line resides is placed in a refresh queue in the memory device (at 808, 810). The refresh queue indicates blocks of the memory that have been identified as to be refreshed based on the selected word line scan, so that each block in the queue can be refreshed by copying the block to a new block at a later time. The later time may be based on the initiation of a housekeeping operation such as garbage collection or other background operations that do not interfere with the device's ability to respond to host commands (at 812).

The refresh operation, specifically the copying of the read disturbed block (based on having the greater number of bit errors than the threshold), utilizes the existing error correction code algorithm on the memory system 102 to remove the errors when the block is copied into the new block. The threshold number of errors detected in the scanned upper page of the word line may be configured based on a desired safety margin that balances the need to correct errors before the number of errors exceeds the ability of the particular ECC algorithm to correct (also referred to as the uncorrectable error correction code limit or UECC) with the need to avoid reducing performance and life of the memory by refreshing blocks too frequently.

Figure 9:
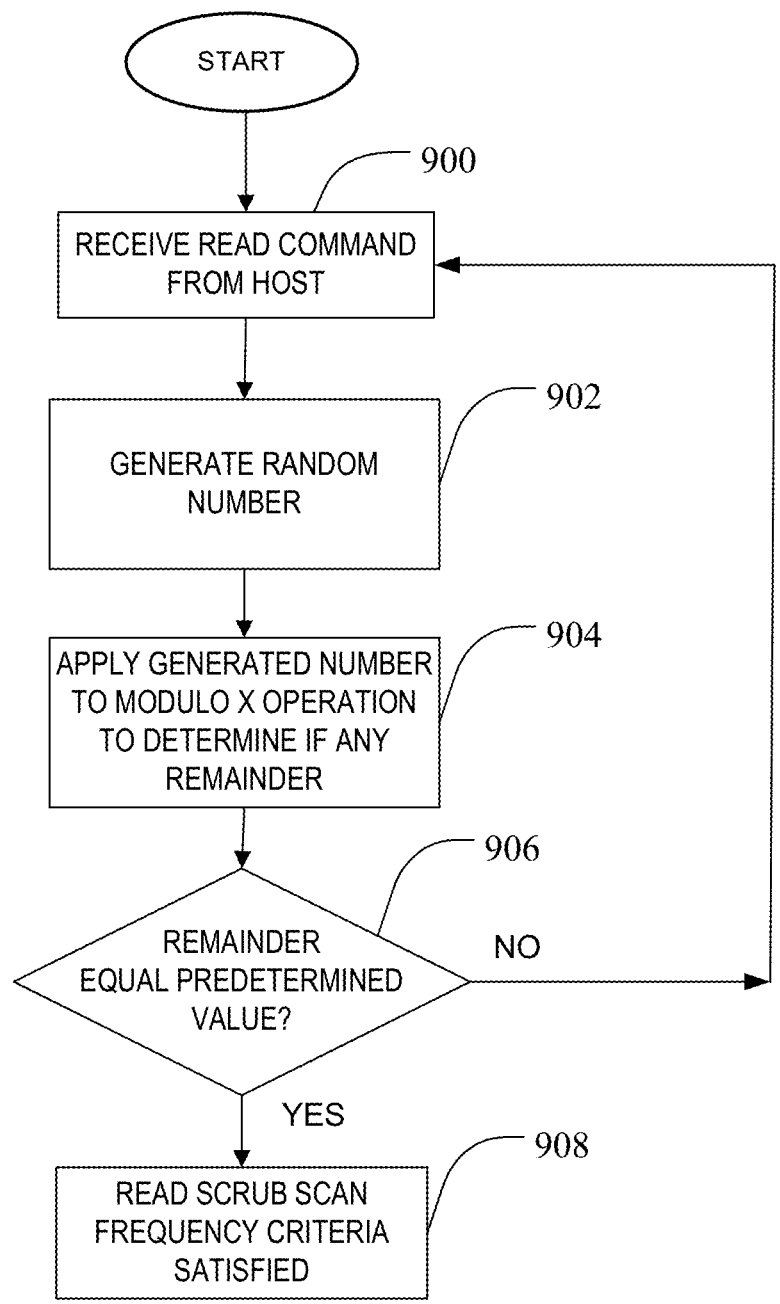
FIG. 9 is a flow chart of an example process for determining whether a read scrub scan frequency criteria has been met.

Although the step of determining whether a read scrub scan of a particular word line is necessary (e.g. controlling the frequency of read scrub scans) may be accomplished using one or more counters that track the number of read operations a block or a word line have experienced, a mechanism that controls the frequency of read scrub scans without the need for such counters is implemented in one embodiment. Referring to FIG. 9, one example method of controlling read scan frequency without storing read counters is illustrated. The method may include utilization of a probability algorithm such as a random number generator.

Upon receipt of a host read command, a random number N would be generated (at 900, 902). The controller then processes the random number to see if this number is divisible by the desired frequency to determine if a read scan is necessary. For example, if the read scan frequency desired is one scan for every X host read commands, the generated random number N may be applied to a modulo X calculation (at 904). For the case where the desired probability is 1 scan for every 1000 host read commands, X would be 1000. Thus, the modulo 1000 operation would be applied to random number N check to determine a remainder. When a number A is divided by a number B, the remainder will have a value between 0 and B−1. Thus in this example, N modulo 1000 will result in a value between 0 and 999 such that there is one chance out of 1000 to have 0 as a remainder. If the remainder is 0, then the read scan scrub frequency criteria is satisfied and the controller may proceed with the scan (at 906, 908). Although one probability calculation technique has been described for determining whether a frequency criteria has been met, other probability calculations or techniques for determining whether to perform a read scrub scan may be implemented. In one embodiment, the frequency may be a predetermined fixed amount. In other embodiments, the predetermined frequency may change based on the number of write/erase cycles (e.g. the frequency of read scrub scans may be increased as the cumulative number of write/erase cycles increases for flash memory device), memory system fullness or other factors.

Figure 10:
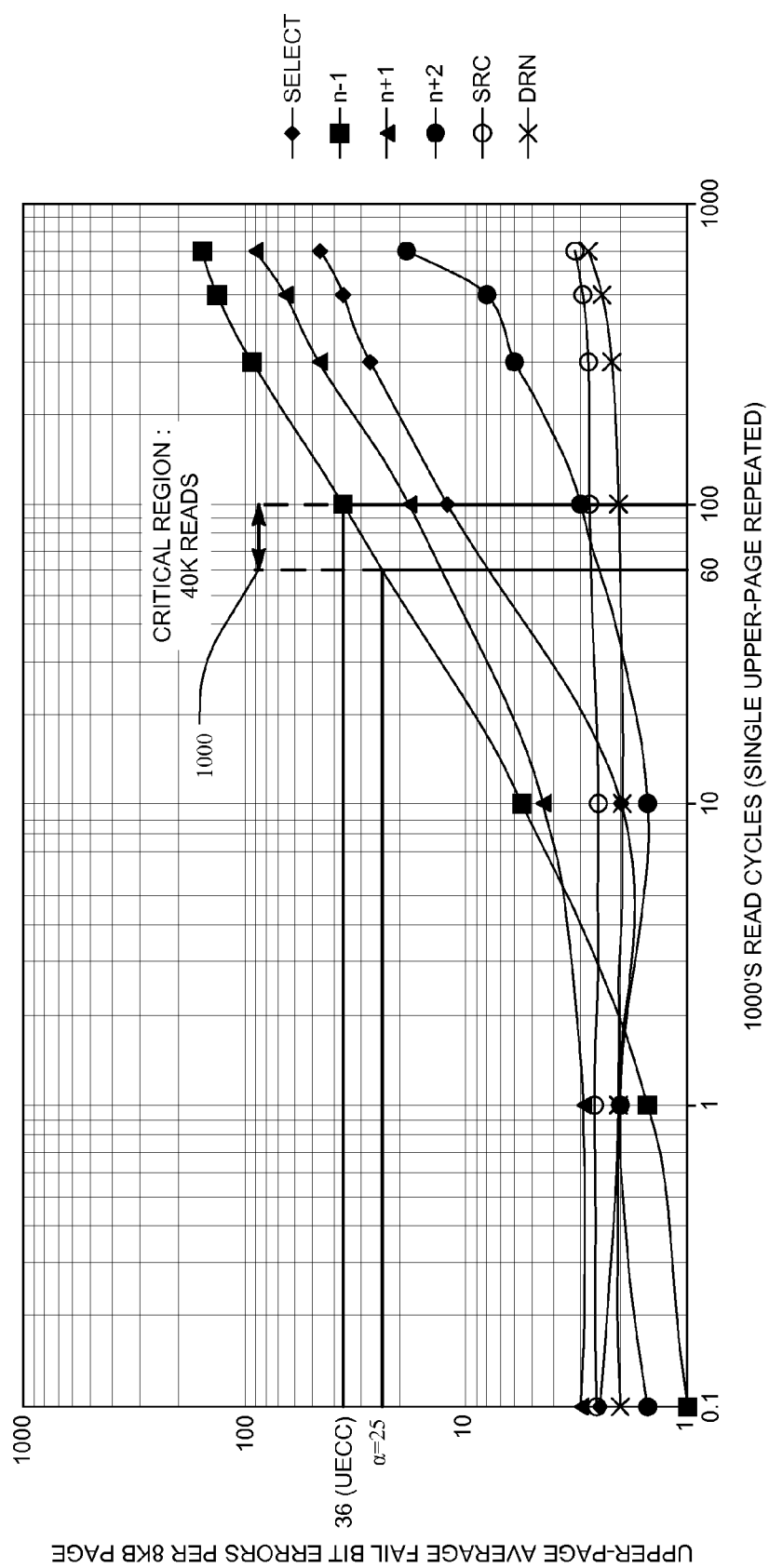
FIG. 10 illustrates a hypothetical read error characterization chart for a two bit per cell MLC memory.

The particular word line offset, the frequency with which the memory system performs a read scan, and the number of errors (in an upper page of a selected word line) set as the threshold for refreshing a block may be predetermined in any of a number of ways. For example, referring to FIG. 10, the manufacturer may test a particular memory system design to identify error rates for different word line offsets. In the hypothetical analysis of an MLC flash memory shown in FIG. 10, the word lines offset at n−1 and n+1 from the word lines within a host read command appear to be the first and second most susceptible word lines to read disturb effects. The n−1 word line represents the word line prior to the first word line read of a read command, while the n+1 word line refers to the word line immediately after the last read word line for a read command. FIG. 10 shows 'single word line read disturb' data. To achieve results such as illustrated in FIG. 10, the upper page of WLn (named as 'select' in the legend of the graph) may be repeatedly, up to 700,000 read cycles in this example, read and the read disturb level evaluated on other word lines in the block by tracking the number of bit errors on their upper pages. The neighboring WLs (WLn−1, WLn+1, WLn+2) are the only ones shown in this example because they are the ones that have the highest number of bit errors, and hence were the most exposed to read disturb effects. Based on this data, for this particular flash memory device design WLn−1 and WLn+1 are the best candidates for a read disturb check as described above.

The most susceptible word lines, and the average errors, may be different in different designs and FIG. 10 is merely one example of what a device characterization graph might look like. Using such a characterization graph, a manufacturer may store in non-volatile memory on the memory system one or more of the word line offsets for the most read disturb susceptible word lines. Similarly, the frequency for read scrub scans may be selected and stored in non-volatile memory by the manufacturer based on the number of cycles before a UECC condition is met and the buffer 1000 that is desired before reaching that critical number of cycles. The predetermined number of errors found in an identified upper page of a word line that causes the controller to place a block in a refresh queue may also be selected by the manufacture from an analysis chart. Assuming that the uncorrectable error correction code (UECC) limit for the particular error code being used is 36, a threshold error limit may be selected below that UECC level by enough read cycle buffer. In the example of FIG. 10, the threshold error level is shown as 25 errors. In one embodiment, the predetermined number of errors and the predetermined read scrub scan frequency may depend on the read disturb rate of the most exposed word lines. In FIG. 10, if the WLn−1 curve is steeper and the read scrub threshold is kept at the same value (25) the margin of read operations until the system reaches UECC is tighter. In this case, the read scrub threshold could be decreased to give the system more margin, or the read scan frequency could be increased.

Figure 11:
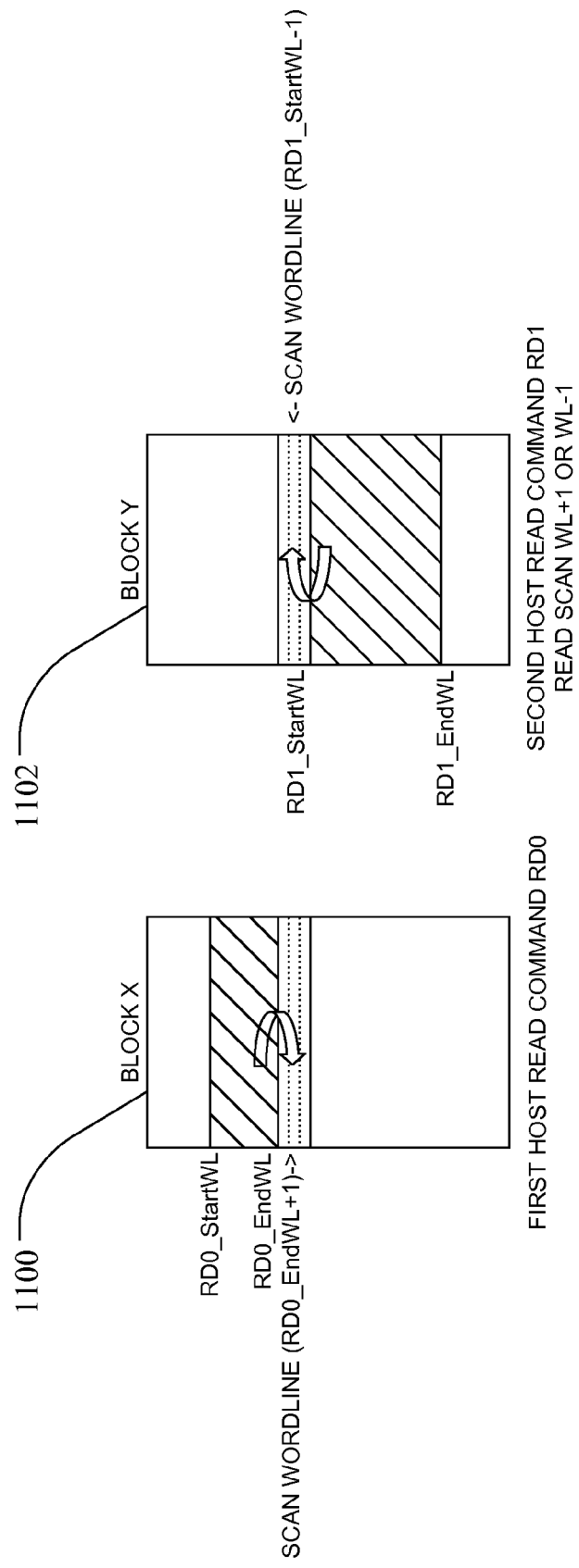
FIG. 11 illustrates a method of applying the targeted read scrub method of FIG. 8 in response to host read commands.

One example of the method described in FIGS. 8-9 is shown in FIG. 11. FIG. 11 shows two blocks 1100, 1102 in the long term (MLC) memory of a memory system 102. Assuming a first host read command (RD0) is received by the controller of the memory system that requests data from block X 1100, the controller will read data from the range of sequential word lines identified in that data to the host, which are word lines RD0_StartWL through RD0_EndWL in this example. In response to the first host read command, the controller will determine if a read scan is necessary based on the frequency criteria as discussed above. Again, the necessity of the read scan is based on the frequency desired to maintain checks that are frequent enough to avoid reaching the UECC level due to read disturb effects. If the frequency criteria has not been satisfied, a read scrub scan to look for errors is not executed and the next host read command RD1 is processed. Host read command RD1, as illustrated in FIG. 11, shows a read command directed to word lines in block Y 1102. The example read command RD 1 includes word lines beginning RD1_StartWL and ending at RD1_EndWL. Again, in response to the read command (either before or after executing the read command), the process of FIG. 8 is followed to determine whether a scan is necessary by running through the probability sequence such as described in FIG. 9. If the controller then determines that the frequency criteria has been met to run a read scrub scan based on RD1, the appropriate word line to scan is identified and the upper page of that word line is then scanned.

Assuming that the memory system in this example includes an exemplary two-bit per cell MLC memory characterized in FIG. 10, the two most susceptible word lines, are the n−1 word line, which represents the word line immediately before the first word line of the most recent host write (RD1_StartWL) or the n+1 word line, which relates to the word line after the last word line of prior host read command (RD0_EndWL). In embodiments where only a single susceptible word line option is stored in the non-volatile memory for use by the controller, the n−1 word line is the only offset used by the controller to target a word line to scan and then possibly refresh. In other embodiments, more than one predetermined word line offset option may be stored in the non-volatile memory for use by the controller in a read scan operation. In embodiments where the predetermined word line offset includes more than one offset (e.g. the two highest read disturb susceptible offsets n−1 and n+1 as in FIG. 10), the controller may opt to use a random number test to select from the more than one option, may cycle linearly through each of the different word line options each time a read scan is to take place or may select one of the available susceptible word line offsets in any of any other ways. Thus, in this latter embodiment having two possible predetermined offsets (n−1 or n+1), the controller may either scan the upper page of word line RD1_StartWL−1 or RD0_EndWL+1 depending on which one of these two predetermined offsets the controller selects.

Figure 12:
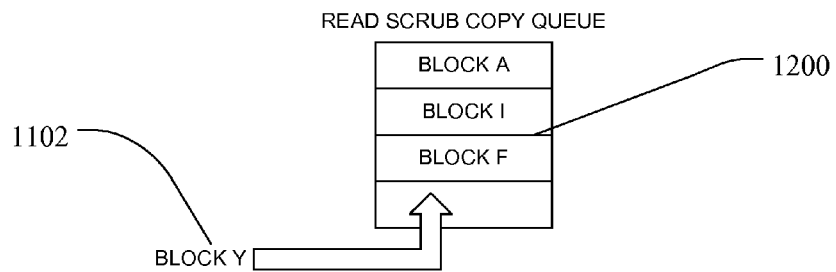
FIG. 12 illustrates a read scrub queue maintained by the controller of the memory system of FIG. 1.
Figure 13:
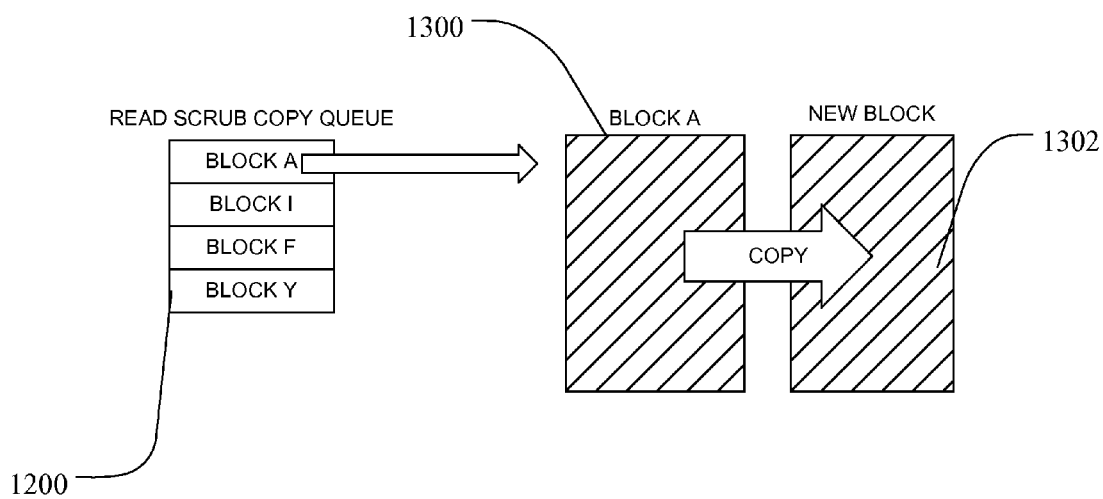
FIG. 13 illustrates a block from the refresh queue of FIG. 12 being refreshed in a copy (refresh) operation.

Referring to FIG. 12, if word line RD1_StartWL of block Y 1102 is targeted and scanned for errors, and if the number of bit errors found in the scan exceed the error threshold parameter for refreshing a block, block Y is routed to a refresh queue 1200. The refresh queue 1200 includes those blocks having bit errors in targeted word lines that exceed the threshold set in the device (but are below the UECC level). The refresh queue may be stored in controller RAM or in non-volatile memory. The queue may be managed by the controller as a first-in-first-out (FIFO) queue or blocks in the queue may be selected out of order. Referring to FIG. 13, when the controller is ready to refresh a block identified in the queue, in this example block A, the data from block A 1300 is refreshed by copying all of the data from A to a new block 1302. As noted previously, the bit errors from block A may be corrected by the ECC algorithm for the storage device during copying. In this way, the new block 1302 will contain a corrected version after the copy (refresh) operations.

Figure 14:
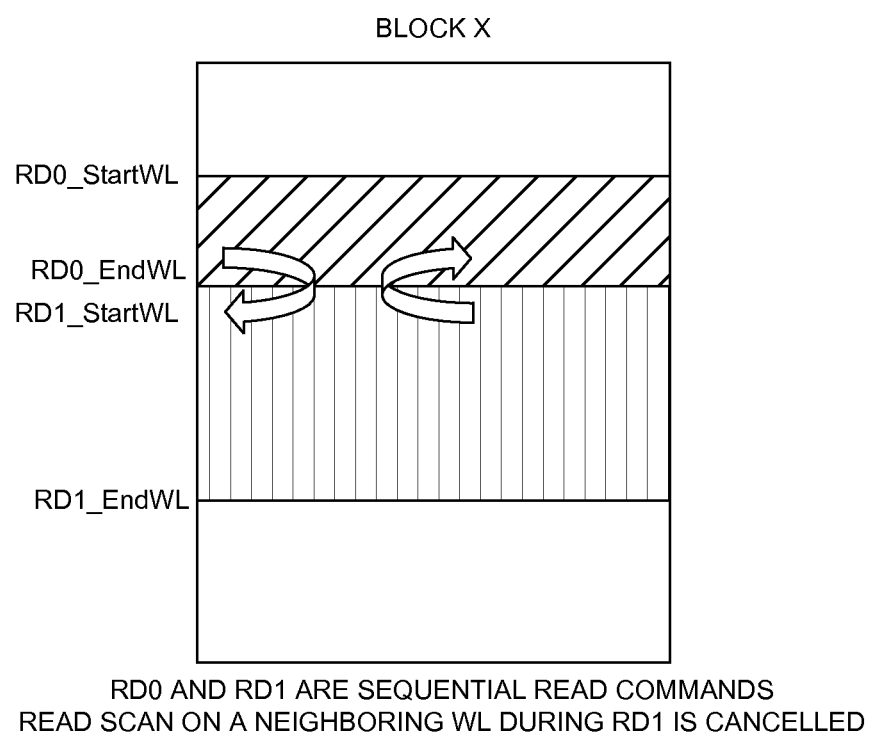
FIG. 14 illustrates an alternative embodiment of the method of FIG. 11 where consecutive read commands are received for sequentially positioned word lines.

The above embodiments illustrate a memory system and method where timing of read scrub scans are determined in ways other than storing counters on word line or block reads, and then only a portion of a single targeted word line at a predetermined offset is scanned for errors. In one alternative embodiment, an optimization of the read scrub scan and refresh algorithm described above may include skipping a scan of a targeted word line, under certain conditions, even if the read scrub scan frequency criteria has been met. Referring to FIG. 14, an example of a situation in which a read scan would be skipped may include a sequential read detection. If for example the memory system receives two host read commands (RD0 and RD1) that are sequential to each other, where sequential refers to the last word line included in the first read command positioned immediately before the first read word line included in the second read command, the read scrub scan triggered by the second host read command would be skipped. If a read scrub scan were to proceed after the second read command, the word line identified for scanning would either be the (n−1) or (n+1) offset (assuming the same type of MLC memory as discussed above), because the (n−1) word line was already read in the previous command and the (n+1) word line is to be (or just was) read in the RD1 command. The read scrub scan triggered by RD1 can be skipped because a mechanism already exists as part of a read command to check the error levels of word lines being read. Thus the read scrub scan of the n−1 and n+1 word lines in the scenario of FIG. 14 (which would be RD0_EndWL or RD1_StartWL, respectively) would be redundant to the ECC correction applied to these particular word lines as part of the read operations themselves. A goal of a read scrub scan is to make sure that the detection of a read disturb is not missed that is accumulating on a word line in proximity to the word line that has been part of a read command.

In yet other embodiments, read scrub scan frequency, or the number of targeted word lines, may be increased. The read scrub scan frequency for the targeted word lines at predetermined offsets may be increased as the number of write/erase cycles increases for the blocks in the memory system. Alternatively or additionally, the number of word lines given a read scrub scan may be increased as the write/erase cycles for blocks in the memory increases. This scanning of additional word lines may be implemented as more than one targeted word line being scanned as a result of each read command that meets a read scrub scan frequency criteria (e.g. read scrub scanning word lines at two or more predetermined offsets, such as both the n−1 and n+1 offsets described above).

Alternatively, word lines at greater offsets than the predetermined offsets of the targeted word lines may be scanned in addition to the targeted word lines that are scanned at the applicable read scrub scan frequency noted above. When the number of write and erase cycles for blocks increases, the read disturb effect on word lines distant to those word lines that have been read from may become more important. Thus, in one alternate embodiment, random word lines may be scanned at a frequency that is the same or differs from the frequency of the targeted word lines noted in the process above. Furthermore, in yet other embodiments, the frequency of scanning random word lines during host read commands or after a certain write/erase cycle count is reached may be varied. The frequency for scanning random word lines may be increased based on a continuously checked algorithm or may be read from a frequency table that has differing frequency criteria or values corresponding to one or more preset write/erase cycle levels. The read scan process itself, where bit errors are determined for particular word lines, takes a certain amount of processing overhead and time. Thus it is contemplated that the initial frequency for the targeted read scrub scans as described in FIG. 8 and any potential random word line read scans that might be added after a certain number of write/erase cycles would remain low until the number of write/erase cycles for blocks in the memory system have reached a more critical level.

A method and flash memory system have been described taking a probabilistic approach to find and correcting read disturb effects in blocks of memory. The disclosed process has advantages over a typical deterministic approach. A deterministic approach may rely on a read operation counter that is maintained for each block and may include automatically refreshing a block after a fixed amount of read cycles. Unlike this deterministic approach, where potentially too many unnecessary copies of blocks to new blocks are made and where memory must be taken up to account for the one or more counters needed for each block, the probabilistic approach outlined above provides a more efficient way of deciding when to refresh a block based on read disturb effects. In the method described herein, the targeted read scrub scan is triggered at a desired frequency without the use of read counters and then only scans word lines identified as the most susceptible to read disturb effects in a block. As described above, the selected word line may only need one page (e.g. the upper page) to be scanned for read disturb effects. Furthermore, the targeted word line scans and refresh processes described herein are based on actual bit error count thresholds of only one targeted word line, or only a few word lines, of a block as opposed to the automatic refresh cycles blocks are put through based simply on a fixed number of read cycles a block has been through, or a bit error rate of an entire scanned block.

In summary, the above embodiments can be used to provide a way to optimize counteracting read disturb effects while maintaining improved performance in the memory system. It is intended that the foregoing detailed description be understood as an illustration of selected forms that the invention can take and not as a definition of the invention. It is only the following claims, including all equivalents that are intended to define the scope of this invention. Also, some of the following claims may state that a component is operative to perform a certain function or configured for a certain task. It should be noted that these are not restrictive limitations. It should also be noted that the acts recited in the claims can be performed in any order—not necessarily in the order in which they are recited.

We claim:

1. A method for counteracting read disturb effects in a flash memory device comprising:
   in a controller of the flash memory device, the controller:
   receiving a read command from a host;
   determining if a scan for errors in a portion of the flash memory device is necessary in response to the read command; and
   in response to determining that the scan is necessary:
   identifying a word line of the flash memory to scan based on the received read command;
   scanning only the identified word line for data errors, without scanning any other word line in a block containing the identified word line, wherein scanning only the identified word line comprises scanning only an upper page of the identified word line;
   placing the block in a refresh queue if an error threshold is detected in the identified word line; and
   if the error threshold is not detected in the identified word line, waiting for a next read command from the host.

2. The method of claim 1, wherein identifying the word line comprises retrieving a predetermined offset from non-volatile memory, the predetermined offset representing a fixed number of word lines away from a first or last word line associated with a received read command.

3. The method of claim 2, wherein the predetermined offset comprises a plurality of predetermined offsets and identifying the word line comprises selecting one of the predetermined offsets for use in locating the word line.

4. The method of claim 1, wherein determining if the scan for errors is necessary comprises determining if a scan frequency criteria has been met after each read command is received without using read counter information.

5. The method of claim 4, wherein determining if the scan frequency has been met comprises the controller executing a read scrub scan probability algorithm.

6. The method of claim 5, wherein the read scrub scan probability algorithm comprises the controller generating a random number in response to the read command, processing the generated random number through a modulo X operation, where X represents a predetermined frequency, and comparing a result of the modulo X operation to a predetermined number.

7. The method of claim 1, further comprising refreshing the block in the refresh queue during a background operation of the memory system.

8. The method of claim 7, wherein refreshing the block comprises copying data from the block into a new block.

9. The method of claim 1, wherein determining if the scan for errors in the portion of the flash memory device is necessary is done before the received read command is executed.

10. A memory system comprising:
non-volatile memory; and
a controller in communication with the non-volatile memory, the controller configured to:
receive a read command from a host;
determine if a scan for errors in of a portion of the flash memory device is necessary in response to the read command; and
in response to determining that the scan is necessary:
identify a word line of the flash memory to scan based on the received read command;
scan only the identified word line for data errors, without scanning any other word line in a block containing the identified word line, wherein the controller is further configured to scan only an upper page of the identified word line;
place the block in a refresh queue if an error threshold is detected in the identified word line; and
if the error threshold is not detected in the identified word line, wait for a next read command from the host.

11. The memory system of claim 10, wherein to identify the word line, the controller is configured to retrieve a predetermined offset from non-volatile memory, the predetermined offset representing a fixed number of word lines away from a first or last word line associated with the received read command.

12. The memory system of claim 11, wherein the predetermined offset comprises a plurality of predetermined offsets and the controller is configured to identify the word line by selecting one of the predetermined offsets.

13. The memory system of claim 10, wherein to determine if a scan for errors is necessary the controller is configured to determine if a scan frequency criteria has been met after each read command is received without using read counter information.

14. The memory system of claim 13, wherein the controller is further configured to execute a read scrub scan probability algorithm in order to determine if the scan frequency has been met.

15. The memory system of claim 10, wherein the controller is further configured to refresh the block in the refresh queue in a subsequent background operation.

16. The memory system of claim 15, wherein the controller is configured to refresh the block by copying data from the block into a new block.

17. The memory system of claim 10, wherein the controller is configured to determine if the scan for errors in the portion of the flash memory device is necessary before the received read command is executed.

\* \* \* \* \*